(12) United States Patent
Peng

(10) Patent No.: US 7,334,180 B2
(45) Date of Patent: Feb. 19, 2008

(54) OPTICAL ENCODING METHOD

(75) Inventor: Chiung-Ying Peng, Taipei (TW)

(73) Assignee: Via Technologies, Inc., Taipei (TW)

( * ) Notice: Subject to any disclaimer, the term of this patent is extended or adjusted under 35 U.S.C. 154(b) by 549 days.

(21) Appl. No.: 10/921,157

(22) Filed: Aug. 19, 2004

(65) Prior Publication Data

US 2005/0044465 A1 Feb. 24, 2005

Related U.S. Application Data

(60) Provisional application No. 60/496,018, filed on Aug. 19, 2003.

(51) Int. Cl.
*H03M 13/29* (2006.01)
(52) U.S. Cl. ........................ 714/769; 714/804
(58) Field of Classification Search ................ 714/769, 714/804; *H03M 13/29*
See application file for complete search history.

(56) References Cited

U.S. PATENT DOCUMENTS

2003/0028847 A1* 2/2003 Keeler ........................ 714/804
2004/0163026 A1* 8/2004 Lin et al. ..................... 714/758

FOREIGN PATENT DOCUMENTS

JP 2001156649 6/2001

* cited by examiner

*Primary Examiner*—R. Stephen Dildine
(74) *Attorney, Agent, or Firm*—Rabin & Berdo, PC

(57) ABSTRACT

A method for generating parity codes of a data sector having data information and main data. The main data is scrambled to generating outer-code parity. The main data is scrambled to generating inner-code parity. The outer-code parity generating is superior to the inner-code parity generating. The outer-code parity is generated by vertically scrambling the corresponding vertical data block.

15 Claims, 10 Drawing Sheets

| ID IED RSV | 160 bytes main data $D_0 \sim D_{159}$ | R0 |
| 172 bytes main data $D_{160} \sim D_{331}$ | | R1 |
| 172 bytes main data $D_{332} \sim D_{503}$ | | R2 |
| ⋮ | | |
| 168 bytes main data $D_{1880} \sim D_{2047}$ | EDC | R11 |

FIG. 5A

| | C0 | C1 | | | | | |
|---|---|---|---|---|---|---|---|
| R0 | $B_{0,0}$ | $B_{0,1} \sim B_{0,11}$ | $S_0$ | | | $S_{159}$ | |
| R1 | $S_{160}$ | $S_{161}$ | $S_{172}$ | | | $S_{331}$ | |
| R2 | $S_{332}$ | $S_{333}$ | $S_{344}$ | | | $S_{503}$ | |
| | | | | | | | |
| R11 | $S_{1880}$ | $S_{1881}$ | $S_{1892}$ | | $S_{2047}$ | $B_{11,168} \sim B_{11,171}$ | |
| | $PO_0$ | $PO_1$ | $PO_{11}$ | | | $PO_{171}$ | C171 |

FIG. 5B

| Initial preset number | Initial value | Initial preset number | Initial value |
|---|---|---|---|
| 0h | 0001h | 8h | 0010h |
| 1h | 5500h | 9h | 5000h |
| 2h | 0002h | 0Ah | 0020h |
| 3h | 2A00h | 0Bh | 2001h |
| 4h | 0004h | 0Ch | 0040h |
| 5h | 5400h | 0Dh | 4002h |
| 6h | 0008h | 0Eh | 0080h |
| 7h | 2800h | 0Fh | 0005h |

FIG. 8

OPTICAL ENCODING METHOD

CROSS REFERENCE TO RELATED APPLICATION

A related application with the same Applicant as the present invention entitled "optical recording method", application No. 60/496,018, was filed on Aug. 19, 2003.

BACKGROUND OF THE INVENTION

1. Field of the Invention

The present invention relates in general to an optical encoding method. In particular, the present invention relates to a method for generating outer-code parity of data recorded to an optical disc.

2. Description of the Related Art

Formatting of data to an optical disc and error correction thereof are shown in FIGS. 1 and 2. The error correcting process for an optical disk and an ECC block are firstly explained in FIGS. 1A and 1B.

As shown in FIG. 1A, information recorded to the optical disk has a physical structure including a plurality of data sectors. One data sector 20 comprises, in order from the head position thereof, ID information (ID) 21 of a start position of the data sector 20, ID information error detection code (IED) 22 correcting errors in ID information 21, reserve data (RSV) 23, main data 24, and an error detection code (EDC) 25 detecting errors in ID 21, IED 22, RSV 23, and main data 24. A plurality of data sectors are arranged in sequence and constitute recording data.

Next, a process in an encoder, described subsequently, for creating an ECC block by a plurality of data sectors is explained in FIG. 1B. As shown, an ECC block formed by 16 data sectors (i.e. 16) is explained in FIG. 1B. To form the ECC format, where each data sector 20 includes ID 21, IED 22, RSV 23, main data 24, and EDC, each data sector 20 is firstly divided into a plurality of data blocks 33 arranged in 12 lines (one data block in a line) along with y-axis orientation as seen on the left side of FIG. 1B; and each data block comprises 172 bytes.

For each data block 33, an ECC inner-code Parity (PI) 31 having 10 bytes is generated and attached to the end of the each corresponding data block 33 to constitute one correction block 34 as shown on the right side of FIG. 1B. At this stage, correction blocks 34 with PI 31 attached are arranged in 12 lines along with the y-axis orientation. After that, the process is repeated with respect to 16 data sectors (for an ECC block). Accordingly, correction blocks 34 of 192 (=12×16) lines are obtained.

Next, 16 ECC outer-code parity (PO) values 32 are respectively generated and attached to each of the corresponding vertically divided data blocks. It is noted that PO 32 also attaches to a portion of PI 31 within the correction block 34.

From the above mentioned process, one ECC block 30 including 16 data sectors is produced as shown in FIG. 1B (the right side). At this time, the total amount of information included within one ECC block 30 is expressed by:

(172+10)bytes×(192+16)lines=37856 bytes

The main data 24 (i.e., other than parity codes and data information) in it is expressed by:

2048 bytes×16=32768 bytes

In the ECC block 30 shown in FIG. 1B, one byte of data is indicated as [D#. *] For example, [D1. 0] indicates a one byte data seed value (data position) in the first line and column zero, and [D190. 170] indicates a one byte data seed value at line 190 and column 170. Thus, PI 31 is positioned at columns 172 to 181 respectively, and PO 32 is positioned at lines 192 to 207 respectively. Correction blocks 34 are consecutively recorded to the optical disk.

ECC block 30 comprises both PI 31 and PO 32, as shown on the right side of FIG. 1B, in order that data arranged along an x-axis orientation in FIG. 1B can be corrected by PI 31 and data arranged along the y-axis orientation by PO 32. It is thus possible to perform error correction along both axes within the ECC block 30 shown in FIG. 1B.

More concretely, for example, if a certain correction block 34, as mentioned above, consecutively recorded to the optical disk, having 182 bytes in total including PI 31, is entirely destroyed by physical damage to the disc, merely one byte of data is lost with respect to PO 32 in one column, as viewed along the y-axis orientation. Thus, by carrying out error correction using PO 32 at each column, it is possible to accurately reproduce original information from the damaged location, even though one correction block 34 may be entirely destroyed.

The manner of actually recording a data sector 20 included in the ECC block 30 shown in FIG. 1B is shown in FIG. 2. In FIG. 2, the data indicated in [D#. *] corresponds to the data shown on the right side of FIG. 1B. Processes at the time of recording the data sector 20 in FIG. 2 (i.e. an interleave process and an 8 to 16 modulation process) are performed by the encoder, described subsequently.

When recording the ECC blocks 30 to the optical disk, the plurality of data blocks 33 of the ECC block 30 are firstly aligned along the x-axis orientation for each correction block 34, as shown in a top stage of FIG. 2, and are then interleaved for division into 16 recording sectors 40 (as shown in a second top stage of FIG. 2). At this time, one recording sector 40 includes 2366 bytes (=37856 bytes/16), with a data sector 20, PI 31 and PO 32 intermingled and included in each recording sector 40. However, ID 21 (refer to FIG. 1A) in the data sector 20 positions a head portion of each recording sector 40.

The recording sector 40 is divided into a plurality of segments 41 each comprising data and having 91 bytes, with a header H appended to each (as shown in a third top stage of FIG. 2). Then, one sync frame 42 is produced from one segment 41 by 8 to 16 modulating the recording sector 40 including the paired headers H and segments 41. At this time, one sync frame 42 is comprises a header H' and segment 43 (as shown in a bottom stage of FIG. 2). Further, data size in one sync frame 42 is expressed by:

91 bytes×8×(16/8)=1456 bytes

Then, data is written to a disc in continuous sync frames 42. At this time, one recording sector 40 includes 26 sync frames 42.

Using the disclosed physical format and recording to the optical disk, the 8 to 16 demodulation and de-interleaving (refer to FIG. 2) are performed when reproducing the data to thereby reproduce the original ECC block 30 while performing effective error correction to accurately reproduce the data.

As shown in FIG. 3, U.S. Pat. No. 5,815,472 discloses an information recording apparatus that records to a DVD-R as explained previously. The following assumptions are made in the embodiment described; pre-pits or the like are formed in advance on the information tracks, to which data will be recorded. Then, at the time of recording, address information of the optical disk 1 is obtained by detecting the pre-pits.

Thus, a record position for the optical disk is detected. The conventional information recording apparatus S comprises a pickup 2, a reproduction amplifier (AMP) 3, a decoder 4, a pre-pit signal decoder 5, a spindle motor 6, a servo circuit 7, a processor (CPU) 8, an encoder 9, a power control circuit 11, a laser drive circuit 12, and an interface 13, such as an IDE bus. A data record signal SR is input through the interface 13 from an external host computer 14 to the recording apparatus S. In addition, the encoder 9 is provided with a DRAM 10.

FIG. 4 is a flowchart showing conventional DVD disk encoding. First, main data is read from the host computer 14 through the interface (IDE Bus) 13 shown in FIG. 3 and written to the DRAM 10 (S1). Next, main data restored in the DRAM 10 is read (S2). Next, the 2-byte IED is generated to correct errors in the 4-byte ID information (S3). Next, 6 bytes RSV denoting copyright is generated (S4). Next, 4 bytes EDC is generated for detecting errors (S5). Next, main data is scrambled (S6). The purpose of scrambling the main data is to reduce the likelihood that regular bit patterns will induce a large digital sum value. Therefore, a data sector is obtained. Next, 16 data sectors are attached to the 10 bytes PI (S7). Next, the ID, IED, RSV, EDC, scrambled main data and the PI are stored in the DRAM 10 (S8). The data stored in the DRAM is read again to generate 16 bytes PO(S9), which are then stored in the DRAM interleaving the 16 data sectors (S10). Thus, the data stored in the DRAM is read to be written to the DVD disc (S11).

However, much data is transmitted between the optical drive IC and the memory buffer (DRAM) by the conventional method. Because the PO and the PI are generated according to the scrambled main data stored in the DRAM 10, thus, the original main data stored in the DRAM 10 must be read out from the DRAM 10 to perform scrambling, and stored to the DRAM 10 again after scrambling. In addition, as the main data is used repeatedly, the scrambled main data must be descrambled, and then the PO and the PI are generated according to the descrambled data. Therefore, the recording speed of the optical disc is limited by the bandwidth of the memory buffer. The recording speed of the optical disc can be increased by increasing the clock rate of the memory bus, however, this increases power consumption.

SUMMARY OF THE INVENTION

The object of the present invention is thus to provide a method for encoding optical data. Main data of the data sector is scrambled during readout from the memory buffer, and PO is generated according to the scrambled main data, wherein the scrambled main data is not written to the memory buffer.

To achieve the above-mentioned object, the present invention provides a method for generating parity codes of a data sector having data information and main data. The main data is scrambled to generate outer-code parity. The main data is scrambled to generate inner-code parity. The outer-code parity generating is superior to the inner-code parity generating. The outer-code parity is generated by vertically scrambling the corresponding vertical data block.

In addition, the present invention provides a vertical scrambling method for generating outer parity of recording data, comprising the steps of reading main data from a memory; applying an initial seed value into a vertical scrambling byte calculation equation formula to derive a plurality of scrambling bytes; and scrambling the main data and the corresponding plurality of scrambling bytes to generate the corresponding outer parity, wherein the plurality of scrambling bytes are vertically derived from the scrambling byte calculation equation respectively.

BRIEF DESCRIPTION OF THE DRAWINGS

The present invention will become more fully understood from the detailed description given hereinbelow and the accompanying drawings, given by way of illustration only and thus not intended to be limitative of the present invention.

FIGS. 5A and 5B respectively shows a data sector configuration.

FIG. 8 shows the initial value of shift register.

DETAILED DESCRIPTION OF THE INVENTION

In this application, in order to reducing memory access times and memory bandwidth, an encoding method had been introduced to reduce memory access times and memory bandwidth; in which method PO is firstly generated and PI is then generated. In order to achieve the foregoing encoding method, a vertical scrambling method should be taken in to consideration, thus the present invention accordingly provides a vertical scramble scrambling method.

A scrambling formula is provided as following:

$$D'_K = D_K \char`\^ S_K \text{ (for K=0 to 2047)}; \qquad \text{Equation (1)}$$

where $D'_K$ are scrambled data bytes; $D_K$ are main data bytes; $S_K$ are scrambling bytes with respect to the corresponding $D_K$; "^" stands for Exclusive OR operation.

An ECC block is constructed of 16 data sectors, a data sector includes 12 bytes data information (2 bytes ID, 4 bytes IED, and 6 bytes RSV), 2048 bytes main data, and 4 bytes EDC arranged in sequence. FIGS. 5A and 5B respectively show a data sector configuration, where $B_{0,0} \sim B_{0,11}$ are respectively seed values of corresponding one byte data information, $B_{11,168} \sim B_{11,171}$ are respectively seed values of corresponding one byte EDC, $D_0 \sim D_{2047}$ are main data, $S_0 \sim S_{2047}$ are the respectively corresponding scrambling bytes, and $S_0$ is the initial seed value of the main data.

It is well known that the recording unit is an ECC block which includes 16 data sectors, but in order to explain in detail how to perform vertical scrambling to generate outer parity, only a data sector is taken into consideration in the present invention.

Figure 1A:
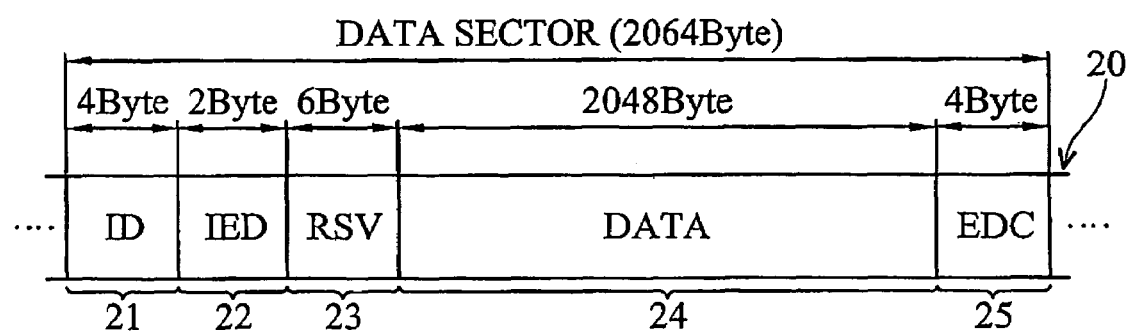
FIG. 1A shows a data structure of recording data.
Figure 1B:
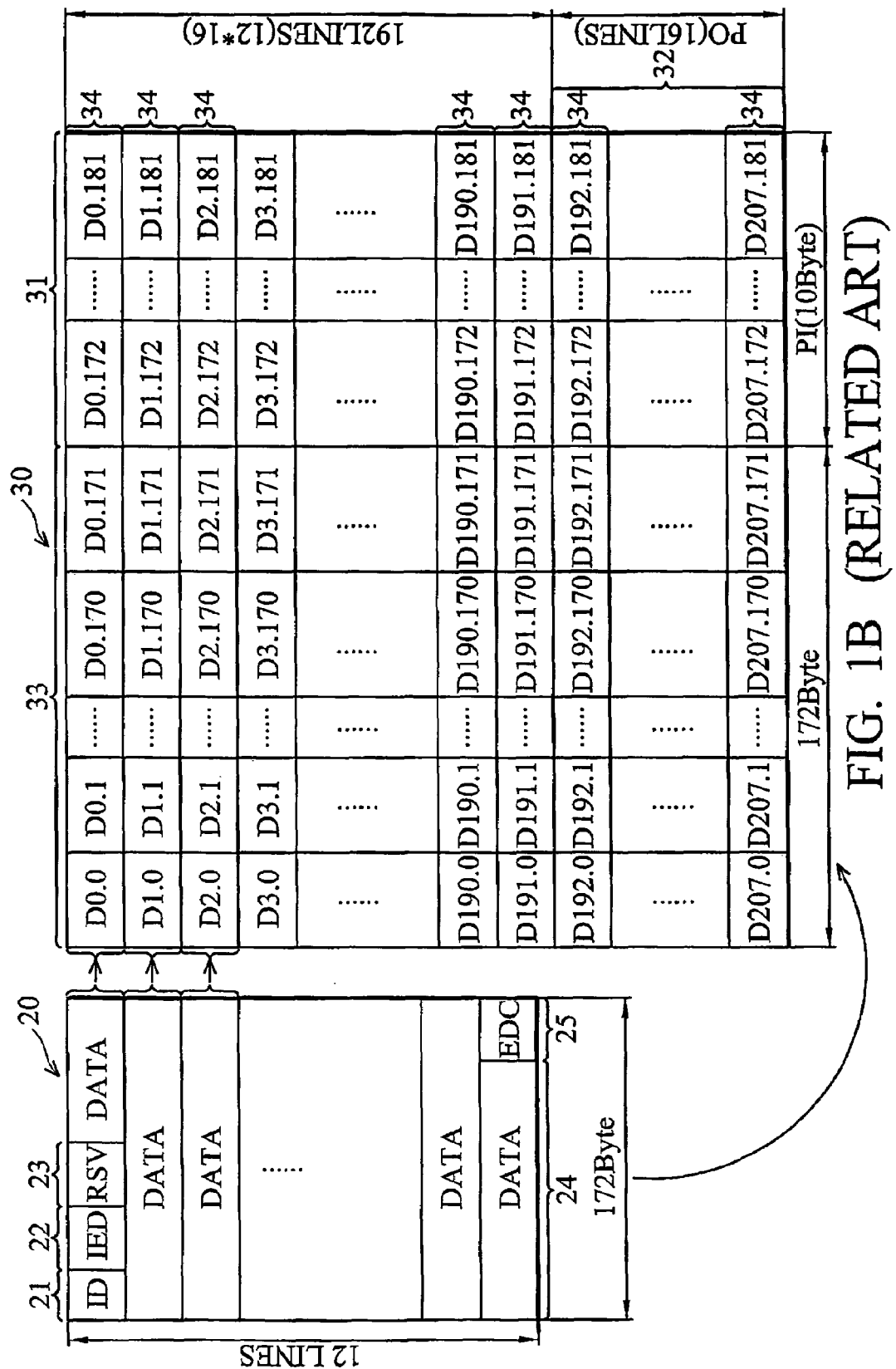
FIG. 1B shows a configuration of an ECC block in the recording data.
Figure 2:
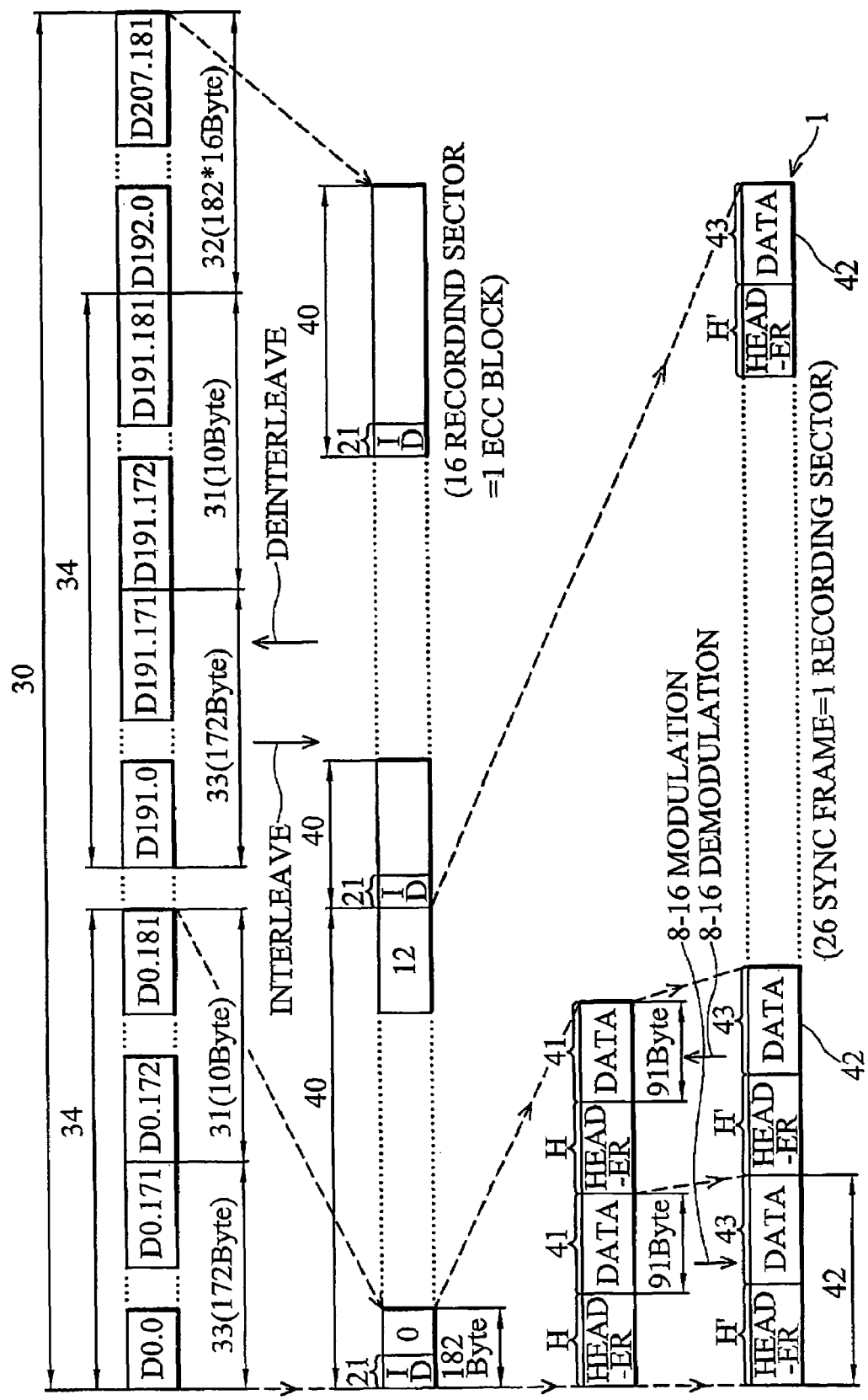
FIG. 2 shows a physical format of recording data.
Figure 3:
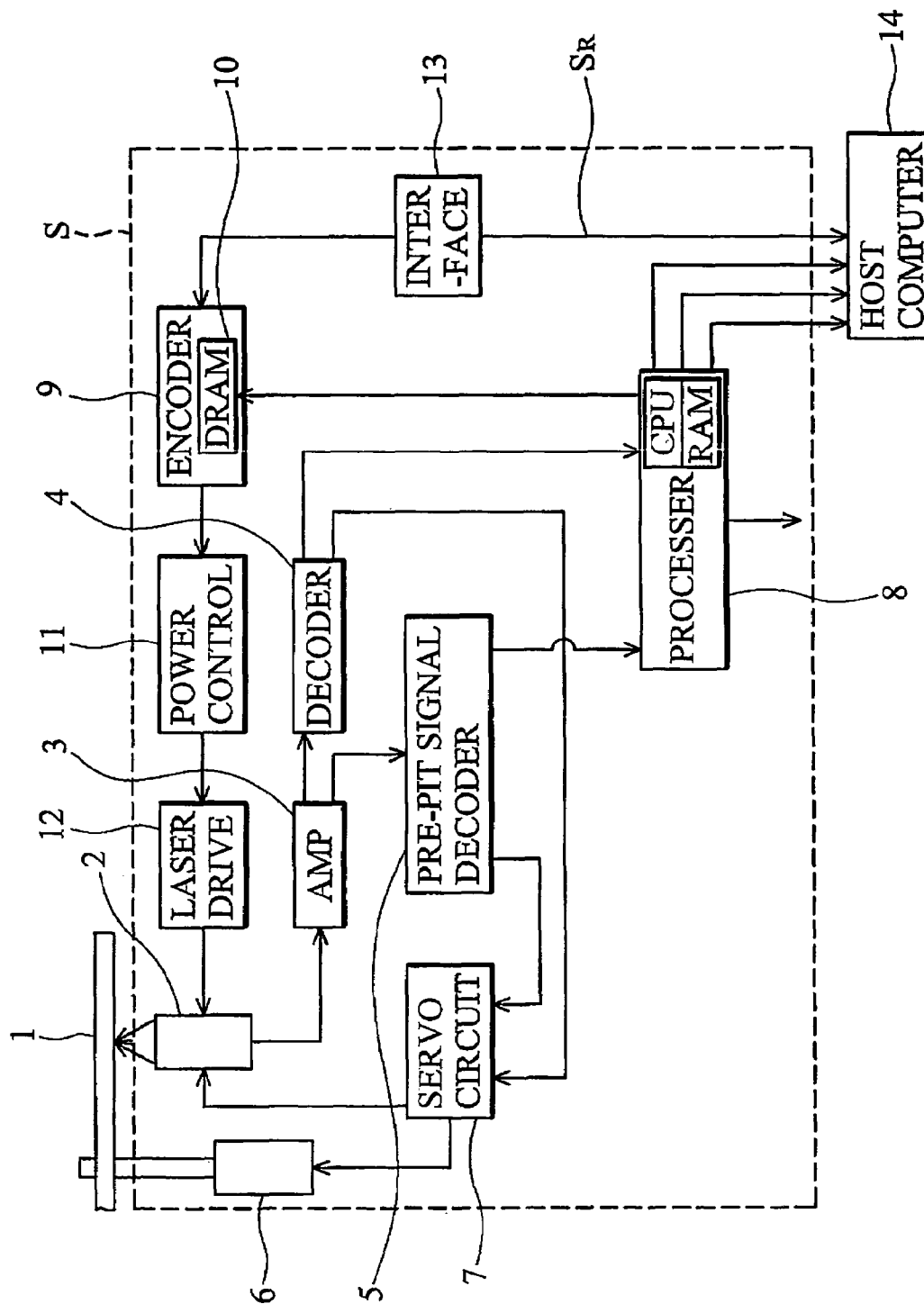
FIG. 3 shows a conventional information recording apparatus.
Figure 4:
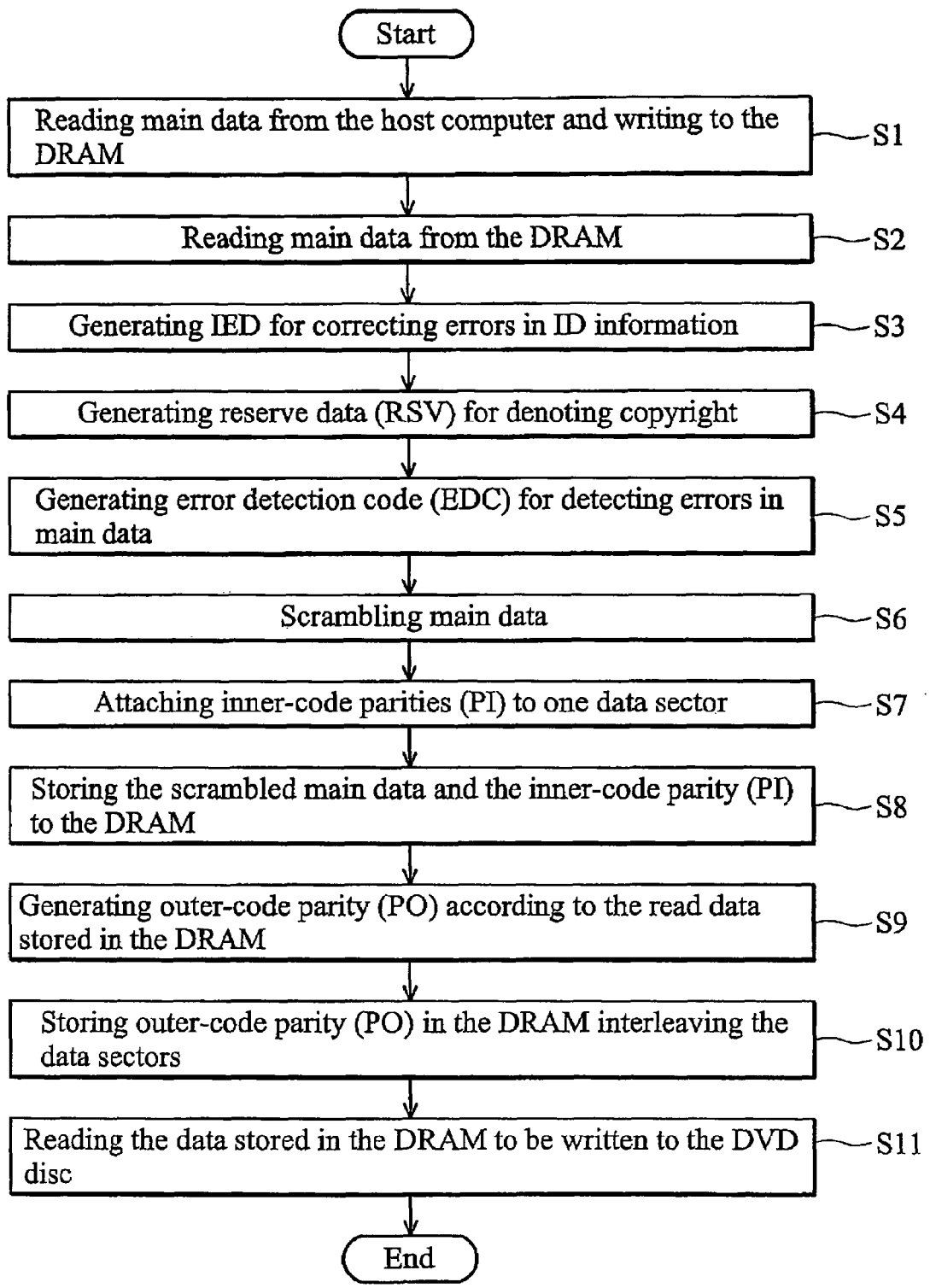
FIG. 4 is a flowchart showing conventional DVD disk encoding.
Figure 6:
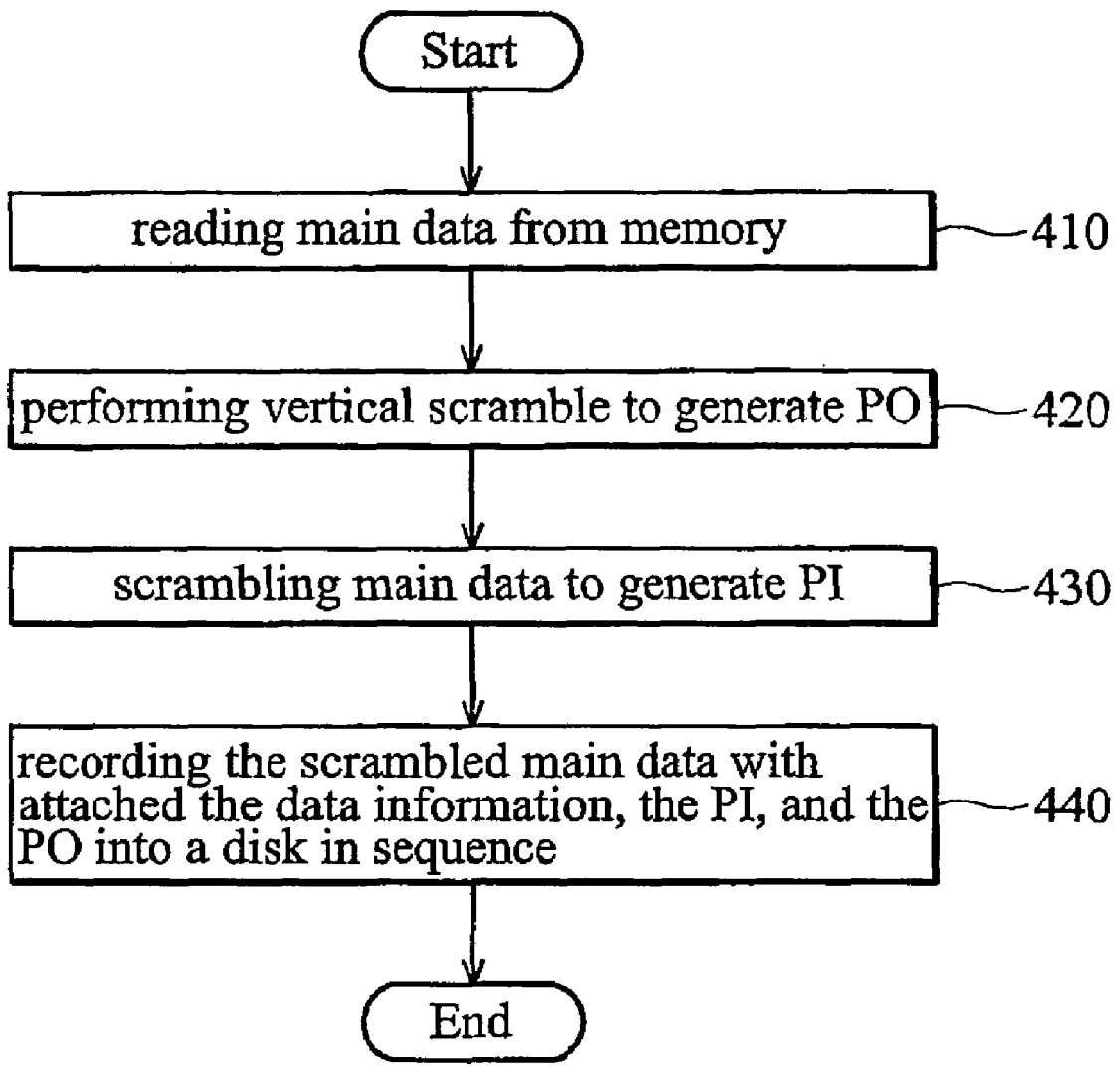
FIG. 6 is a flowchart of the encoding method of the present invention.

The recoding method of the present invention is shown in FIG. 6, including the following steps:

410 reading main data from memory;

420 performing vertical scrambling to generate PO;

430 scrambling main data to generate PI; and 440 recording the scrambled main data with the data information, the PI, and the PO attached into a disk in sequence.

It is noted that in the present invention, PO is generated before PI by performing vertical scrambling.

Figure 7:
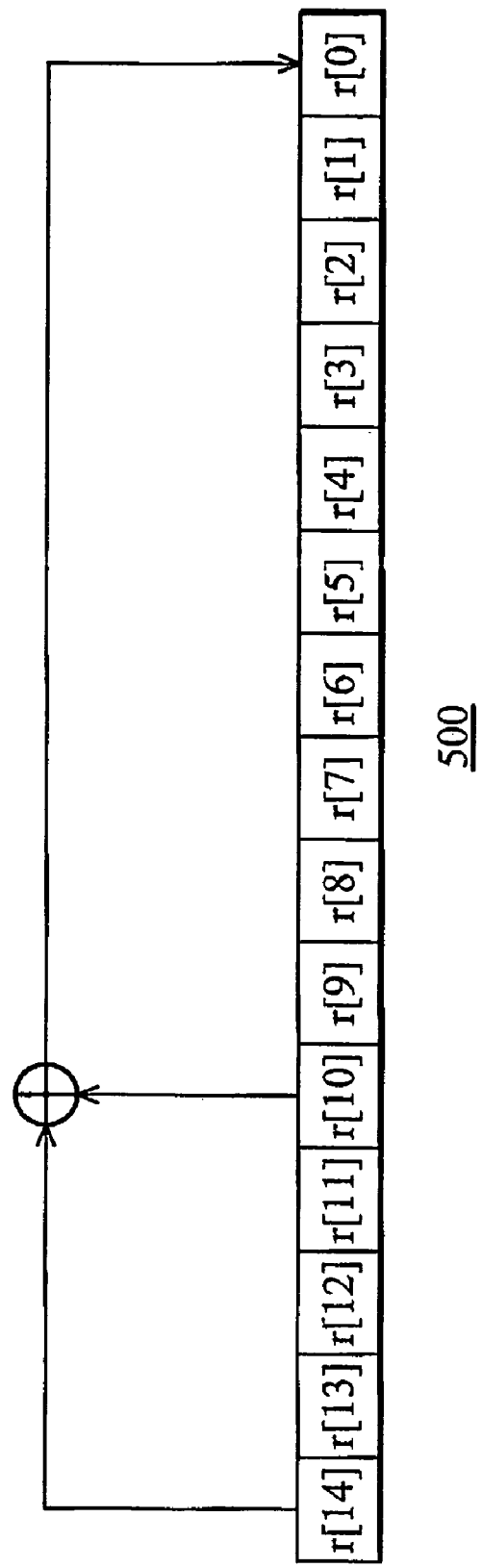
FIG. 7 is a one bit feedback shift register.

FIG. 7 is a one bit feedback shift register 500 which is given for generating scrambling bytes $S_K$ (K=0 to 2047). FIG. 8 shows the initial value for generating $S_K$ from DVD specification. This is well known to those skilled in the art and will not be described here in detail.

There are two ways to derive each scrambling byte to perform vertical scrambling. One conventional way is to sequentially derive each scrambling bytes from the initial seed value $S_0$. That is, deriving $S_1$ from $S_0$, and then deriving $S_2$ from $S_1$ and so on. After all scrambling bytes $S_0 \sim S_{2047}$ are figured out, then vertical scrambling is performed to derive accordingly PO (i.e. for example, $PO_0$ is derived by vertical scrambling $S_{160}$, $S_{332}$, $S_{1880}$.). It is observed that by the above described method, the scrambling bytes are respectively generated in sequence, vertical scrambling is then performed, and as a result the memory access time is not reduced.

Referring to FIG. 7, in order to perform the above mentioned method, after the one bit shift register is repeated 8 times, the next scrambling byte could be figured out from the last known scrambling byte.

In the present invention, a first scrambling byte calculation equation (Equation (2)) is introduced form the feedback shift register 500 after performing shifting 8 times, thus the next one byte scrambling byte could be derived by applying the last known scrambling byte into the equation:

$$nr[0]=r[3]\char`\^r[7];\ nr[1]=r[4]\char`\^r[8];\ nr[2]=r[5]\char`\^r[9];$$

$$nr[3]=r[6]\char`\^r[10];\ nr[4]=r[7]\char`\^r[11];\ nr[5]=r[8]\char`\^r[12];$$

$$nr[6]=r[9]\char`\^r[13];\ nr[7]=r[10]\char`\^r[14];\ nr[8]=r[0];\ nr[9]=r[1];$$

$$nr[10]=r[2];\ nr[11]=r[3];\ nr[12]=r[4];\ nr[13]=r[5];\ nr[14]=r[6]; \qquad \text{Equation (2)}.$$

where $r[0] \sim r[14]$ stands for the last known scrambling byte $S_x$ and $nr[0] \sim nr[14]$ stands for the next unknown scrambling byte $S_{x+1}$, (where x=0~2046); the sample "^" stands for Exclusive OR operation.

For example, FIG. 8 shows the initial value of shift register 500 presented in hexadecimal. By applying the initial value (where $r[0] \sim r[7]$ stands for $S_0$) of FIG. 8 into the Equation (2), the next scrambling byte $S_1$ could be derived ($nr[0] \sim nr[7]$); then applying $S_1$ into the Equation (2), thus the next scrambling byte $S_2$ could be derived, and so on.

To simply the calculation process, a second scrambling byte calculation equation is provided in the present invention, thus each scrambling bytes could be vertically derived and then could perform the vertical scrambling to derive outer parity PO. For example, applying the known initial seed value $S_0$ into the calculation mechanism, then vertical next scrambling $S_{172}$ could be figured out, and then $S_{344}$, $S_{516}$, ... $S_{1892}$ could be also figured out accordingly, and then vertically scrambling $S_0$, $S_{344}$, $S_{516}$, ... $S_{1892}$ to generate corresponding $PO_{12}$.

The following shows the second scrambling byte calculation equation (Equation (3)). The equation is predicted from repeating Equation (2) 172 times, thus the scrambling byte after 172 bytes could be derived by applying the equation:

$$nr[0]=r[1]\char`\^r[3]\char`\^r[5]\char`\^r[7]\char`\^r[8]\char`\^r[10]\char`\^r[11]\char`\^r[12]\char`\^r[13];$$

$$nr[1]=r[2]\char`\^r[4]\char`\^r[6]\char`\^r[8]\char`\^r[9]\char`\^r[11]\char`\^r[12]\char`\^r[13]\char`\^r[14];$$

$$nr[2]=r[0]\char`\^r[3]\char`\^r[5]\char`\^r[7]\char`\^r[9]\char`\^r[10]\char`\^r[11]\char`\^r[12]\char`\^r[13]\char`\^r[14];$$

$$nr[3]=r[0]\char`\^r[1]\char`\^r[4]\char`\^r[6]\char`\^r[8]\char`\^r[10]\char`\^r[12]\char`\^r[13]\char`\^r[14];$$

$$nr[4]=r[0]\char`\^r[1]\char`\^r[2]\char`\^r[5]\char`\^r[7]\char`\^r[9]\char`\^r[13]\char`\^r[14];$$

$$nr[5]=r[0]\char`\^r[1]\char`\^r[2]\char`\^r[3]\char`\^r[6]\char`\^r[8]\char`\^r[10]\char`\^r[11]\char`\^r[14];$$

$$nr[6]=r[0]\char`\^r[1]\char`\^r[2]\char`\^r[3]\char`\^r[4]\char`\^r[7]\char`\^r[9]\char`\^r[12];$$

$$nr[7]=r[1]\char`\^r[2]\char`\^r[3]\char`\^r[4]\char`\^r[5]\char`\^r[8]\char`\^r[12]\char`\^r[13];$$

$$nr[8]=r[2]\char`\^r[3]\char`\^r[4]\char`\^r[5]\char`\^r[6]\char`\^r[9]\char`\^r[11]\char`\^r[14];$$

$$nr[9]=r[0]\char`\^r[3]\char`\^r[4]\char`\^r[5]\char`\^r[6]\char`\^r[7]\char`\^r[10]\char`\^r[11]\char`\^r[12];$$

$$nr[10]=r[1]\char`\^r[4]\char`\^r[5]\char`\^r[6]\char`\^r[7]\char`\^r[8]\char`\^r[11]\char`\^r[12]\char`\^r[13];$$

$$nr[11]=r[2]\char`\^r[5]\char`\^r[6]\char`\^r[7]\char`\^r[8]\char`\^r[9]\char`\^r[12]\char`\^r[13]\char`\^r[14];$$

$$nr[12]=r[0]\char`\^r[3]\char`\^r[6]\char`\^r[7]\char`\^r[8]\char`\^r[9]\char`\^r[10]\char`\^r[11]\char`\^r[13]\char`\^r[14];$$

$$nr[13]=r[0]\char`\^r[1]\char`\^r[4]\char`\^r[7]\char`\^r[8]\char`\^r[9]\char`\^r[10]\char`\^r[12]\char`\^r[14];$$

$$nr[14]=r[0]\char`\^r[1]\char`\^r[2]\char`\^r[5]\char`\^r[8]\char`\^r[9]\char`\^r[10]\char`\^r[13]; \qquad \text{Equation (3)}$$

where $r[0] \sim r[14]$ stands for the last known scrambling byte $S_x$ and $nr[0] \sim nr[14]$ stands for the unknown next vertical scrambling byte $S_{x+172}$ (where the initial x=0); the sample "^" stands for Exclusive OR operation.

For example, by applying the initial value (where $r[0] \sim r[7]$ stands for $S_0$) of FIG. 8 into the Equation (3), the vertical next scrambling byte $S_{172}$ could be derived ($nr[0] \sim nr[7]$); then applying $S_{172}$ into the Equation (3), thus the vertical next scrambling byte $S_{344}$ could be derived, and so on.

Referring to FIG. 5B, in the present invention the method to vertically generate outer parity PO is described as follows.

Taking the $PO_0$ as an example, the method to generating $PO_0$ includes: left shifting 12 bytes of the initial seed value $S_0$ to derive the first seed value of the data sector, $B_{0,0}$ (i.e. the first seed value of the first byte of ID), it is noted that, the initial seed value $S_0$ could be regarded as the result of applying Equation (2) 12 times with the initial value $B_{0,0}$, thus due to the exclusive OR operation, the $B_{0,0}$ is not the only (i.e. referring to Equation (2), if nr[0] is 1 that either r[3] or r[7] is 1); then applying the known $B_{0,0}$ into the Equation (3) to derive the scrambling byte $S_{160}$, and then applying $S_{160}$ into the Equation (3) to derive $S_{332}$ ... ; after all the scrambling bytes of the first column C0 are figured out, applying the main data and the corresponding scrambling bytes into Equation (1) to derive the scrambled data; and then performing vertical scrambling to derive $PO_0$.

Taking $PO_{13}$ as an example, the method to generate $PO_{13}$ includes: applying the initial seed value $S_0$ into Equation (1) to derive the next scrambling byte $S_1$; then applying the known $S_1$ into the Equation (2) to derive the scrambling byte $S_{173}$, and then applying $S_{173}$ into the Equation (2) to derive $S_{345}$ ... ; after all the scrambling bytes of the first column C13 are figured out, applying the main data and the corresponding scrambling bytes into Equation (1) to derive the scrambled data; and then performing vertical scrambling to derive $PO_{13}$.

In the present invention, $PO_{12}$ could be firstly derived by applying the first known initial seed value $S_0$ in to Equation (3). Also, in the present invention, $PO_0$ could be firstly derived by deriving initial value $B_{0,0}$ from $S_0$, thus the outer-code parity PO could be sequentially derived.

It is noticed that the method described above is not limited. For example, $S_{173}$ could be derived from applying $S_1$ into the Equation (3), or derived from applying other scrambling byte in R2 into Equation (2) at least one time.

The other outer parity values $PO_1 \sim PO_{172}$ could be derived in similar ways, and will not be described in more detail here.

The present invention provides a method for vertically generating scrambling bytes. The present invention also provides a vertical scrambling method to generate outer parity. As a result, memory access times could be reduced and memory bandwidth could be also reduced.

The foregoing description of the invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for generating parity codes of a data sector having data information and main data, comprising:
   scrambling the main data to generate outer-code parity; and
   scrambling the main data to generate inner-code parity;
   wherein outer-code parity generating is superior to the inner-code parity generating and wherein the outer-code parity is generated by vertically scrambling a corresponding vertical data block.

2. The method for generating parity codes of claim 1, further comprising deriving each seed value of the main data before scrambling.

3. The method for generating parity codes of claim 2, wherein the each seed value of the main data could be derived from an initial seed value of the main data by sequential calculation, or by providing a vertical scrambling byte calculation equation.

4. The method for generating parity codes of claim 3, wherein a one byte based scrambling byte calculation equation is provided for sequential calculation, that is: nr[0]=r[3]^r[7]; nr[1]=r[4]^r[8]; nr[2]=r[5]^r[9]; nr[3]=r[6]^r[10]; nr[4]=r[7]^r[11]; nr[5]=r[8]^r[12]; nr[6]=r[9]^r[13]; nr[7]=r[10]^r[14]; nr[8]=r[0]; nr[9]=r[1]; nr[10]=r[2]; nr[11]=r[3]; nr[12]=r[4]; nr[13]=r[5]; nr[14]=r[6]; wherein (r[0], r[1], r[2], r[3], r[4], r[5], r[6], r[7]) is the last known scrambling byte, and (nr[0], nr[1], nr[2], nr[3], nr[4], nr[5], nr[6], nr[7]) is the next unknown scrambling byte.

5. The method for generating parity codes of claim 4, wherein the vertical scrambling byte calculation equation is derived from repeating the one byte based scrambling byte calculation equation 172 times.

6. The method for generating parity codes of claim 5, wherein the vertical scrambling byte calculation equation is:

nr[0]=r[1]^r[3]^r[5]^r[7]^r[8]^r[10]^r[11]^r[12]^r[13];

nr[1]=r[2]^r[4]^r[6]^r[8]^r[9]^r[11]^r[12]^r[13]^r[14];

nr[2]=r[0]^r[3]^r[5]^r[7]^r[9]^r[10]^r[11]^r[12]^r[13]^r[14];

nr[3]=r[0]^r[1]^r[4]^r[6]^r[8]^r[10]^r[12]^r[13]^r[14];

nr[4]=r[0]^r[1]^r[2]^r[5]^r[7]^r[9]^r[13]^r[14];

nr[5]=r[0]^r[1]^r[2]^r[3]^r[6]^r[8]^r[10]^r[11]^r[14];

nr[6]=r[0]^r[1]^r[2]^r[3]^r[4]^r[7]^r[9]^r[12];

nr[7]=r[1]^r[2]^r[3]^r[4]^r[5]^r[8]^r[12]^r[13];

nr[8]=r[2]^r[3]^r[4]^r[5]^r[6]^r[9]^r[11]^r[14];

nr[9]=r[0]^r[3]^r[4]^r[5]^r[6]^r[7]^r[10]^r[11]^r[12];

nr[10]=r[1]^r[4]^r[5]^r[6]^r[7]^r[8]^r[11]^r[12]^r[13];

nr[11]=r[2]^r[5]^r[6]^r[7]^r[8]^r[9]^r[12]^r[13]^r[14];

nr[12]=r[0]^r[3]^r[6]^r[7]^r[8]^r[9]^r[10]^r[11]^r[13]^r[14];

nr[13]=r[0]^r[1]^r[4]^[7]^r[8]^r[9]^r[10]^r[12]^[14];

nr[14]=r[0]^r[1]^[2]^[5]^r[8]^r[9]^r[10]^r[13];

wherein (r[0], r[1], r[2], r[3], r[4], r[5], r[6], r[7]) is the last known scrambling byte, and (nr[0], nr[1], nr[2], nr[3], nr[4], nr[5], nr[6], nr[7]) is the vertical next unknown scrambling byte.

7. A vertical scramble method for generating outer parity of a recording data, comprising:
   reading main data from a memory;
   applying an initial seed value into a vertical scrambling byte calculation equation formula to derive a plurality of scrambling bytes; and
   scrambling the main data and a corresponding plurality of scrambling bytes to generate a corresponding outer parity;
   wherein the plurality of scrambling bytes are vertically derived from a scrambling byte calculation equation respectively.

8. The vertical scramble method of claim 7, wherein the vertical scrambling byte calculation equation is derived by repeating a one byte based scrambling byte calculation equation a plurality of times.

9. The vertical scramble method of claim 8, wherein the one byte based scrambling byte calculation equation is given as: nr[0]=r[3]^r[7]; nr[1]=r[4]^r[8]; nr[2]=r[5]^r[9]; nr[3]=r[6]^r[10]; nr[4]=r[7]^r[11]; nr[5]=r[8]^r[12]; nr[6]=r[9]^r[13]; nr[7]=r[10]^r[14]; nr[8]=r[0]; nr[9]=r[1]; nr[10]=r[2]; nr[11]=r[3]; nr[12]=r[4]; nr[13]=r[5]; nr[14]=r[6]; wherein (r[0], r[1], r[2], r[3], r[4], r[5], r[6], r[7]) is the last known scrambling byte, and (nr[0], nr[1], nr[2], nr[3], nr[4], nr[5], nr[6], nr[7]) is the next unknown scrambling byte.

10. The vertical scramble method of claim 7, wherein the vertical scrambling byte calculation equation is derived by repeating a one byte based scrambling byte calculation equation 172 times.

11. The vertical scramble method of claim 10, wherein the vertical scrambling byte calculation equation is:

nr[0]=r[1]^r[3]^[5]^r[7]^r[8]^r[10]^r[11]^r[12]^r[13];

nr[1]=r[2]^r[4]^r[6]^r[8]^r[9]^r[11]^r[12]^r[13]^r[14];

nr[2]=r[0]^r[3]^r[5]^r[7]^r[9]^r[10]^r[11]^r[12]^r[13]^r[14];

nr[3]=r[0]^r[1]^r[4]^r[6]^r[8]^r[10]^r[12]^r[13]^r[14];

nr[4]=r[0]^r[1]^r[2]^r[5]^r[7]^r[9]^r[13]^r[14];

nr[5]=r[0]^r[1]^[2]^[3]^[6]^r[8]^r[10]^r[11]^[14];

nr[6]=r[0]^r[1]^r[2]^r[3]^r[4]^r[7]^r[9]^r[12];

nr[7]=r[1]^[2]^r[3]^r[4]^r[5]^r[8]^r[12]^r[13];

nr[8]=r[2]^r[3]^r[4]^r[5]^r[6]^r[9]^r[11]^r[14];

nr[9]=r[0]^r[3]^[4]^r[5]^r[6]^r[7]^r[10]^r[11]^r[12];

nr[10]=r[1]^[4]^[5]^[6]^r[7]^r[8]^[13]^[12]^r[13];

nr[11]=r[2]^r[5]^r[6]^r[7]^r[8]^r[9]^r[12]^[13]^r[14];

nr[12]=r[0]^[3]^[6]^r[7]^r[8]^r[9]^r[10]^r[11]^r[13]^r[14];

nr[13]=r[0]^[1]^[4]^[7]^r[8]^r[9]^r[10]^[12]^r[14];

nr[14]=r[0]^r[1]^[2]^[5]^r[8]^[9]^r[10]^r[13];

wherein (r[0], r[1], r[2], r[3], r[4], r[5], r[6], r[7]) is the last known scrambling byte, and (nr[0], nr[1], nr[2], nr[3], nr[4], nr[5], nr[6], nr[7]) is the vertical next unknown scrambling byte.

12. A method for vertically deriving an objective scrambling byte from a known initial seed value, comprising:
getting an objective seed value by continuously applying the initial seed value into a one byte based scrambling byte calculation equation at least one time; and
applying the objective seed value into a vertical scrambling byte calculation equation to derive the objective scrambling byte.

13. The method for vertically deriving an objective scrambling byte of claim 12, wherein the method further comprises left shifting the initial seed value to get the objective seed value.

14. The method for vertically deriving an objective scrambling byte of claim 12, wherein the one byte based scrambling byte calculation equation is: nr[0]=r[3]^r[7]; nr[1]^r[4]^r[8]; nr[2]=r[5]^r[9]; nr[3]=r[6]^r[10]; nr[4]=r[7]^r[11]; nr[5]=r[8]^r[12]; nr[6]=r[9]^r[13]; nr[7]=r[10]^r[14]; nr[8]=r[0]; nr[9]=r[1]; nr[10]=r[2]; nr[11]=r[3]; nr[12]=r[4]; nr[13]=r[5]; nr[14]=r[6]; wherein (r[0], r[1], r[2], r[3], r[4], r[5], r[6], r[7]) is the last known scrambling byte, and (nr[0], nr[1], nr[2], nr[3], nr[4], nr[5], nr[6], nr[7]) is the next unknown scrambling byte.

15. The method of claim 12, wherein the vertical scrambling byte calculation equation is:

nr[0]=r[1]^r[3]^r[5]^r[7]^r[8]^r[10]^r[11]^r[12]^r[13];

nr[1]=r[2]^r[4]^r[6]^r[8]^r[9]^r[11]^r[12]^r[13]^r[14];

nr[2]=r[0]^r[3]^r[5]^r[7]^r[9]^r[10]^r[11]^r[12]^r[13]^r[14];

nr[3]=r[0]^r[1]^r[4]^r[6]^r[8]^r[10]^r[12]^r[13]^r[14];

nr[4]=r[0]^r[1]^r[2]^r[5]^r[7]^r[9]^r[13]^r[14];

nr[5]^r[0]^r[1]^r[2]^r[3]^r[6]^r[8]^r[10]^r[11]^r[14];

nr[6]=r[0]^r[1]^r[2]^r[3]^r[4]^r[7]^r[9]^r[12];

nr[7]=r[1]^r[2]^r[3]^r[4]^r[5]^r[8]^r[12]^r[13];

nr[8]=r[2]^r[3]^r[4]^r[5]^r[6]^r[9]^r[11]^r[14];

nr[9]=r[0]^r[3]^r[4]^r[5]^r[6]^r[7]^r[10]^r[11]^r[12];

nr[10]=r[1]^r[4]^r[5]^r[6]^r[7]^r[8]^r[11]^r[12]^r[13];

nr[11]=r[2]^r[5]^r[6]^[7]^[8]^[9]^r[12]^[13]^r[14];

nr[12]=r[0]^[3]^r[6]^r[8]^r[9]^r[10]^r[11]^r[13]^r[14];

nr[13]=r[0]^r[1]^r[4]^r[7]^r[8]^r[9]^r[10]^r[12]^r[14];

nr[14]=r[0]^r[1]^r[2]^r[5]^r[8]^r[9]^r[10]^r[13];

wherein (r[0], r[1], r[2], r[3], r[4], r[5], r[6], r[7]) is the last known scrambling byte, and (nr[0], nr[1], nr[2], nr[3], nr[4], nr[5], nr[6], nr[7]) is the vertical next unknown scrambling byte.

\* \* \* \* \*